(12) United States Patent
Sasaki (10) Patent No.: US 10,974,323 B2
(45) Date of Patent: Apr. 13, 2021

(54) COATED CUTTING TOOL

(71) Applicant: Mitsubishi Hitachi Tool Engineering, Ltd., Tokyo (JP)

(72) Inventor: Tomoya Sasaki, Yasu (JP)

(73) Assignee: MOLDINO Tool Engineering, Ltd., Tokyo (JP)

( * ) Notice: Subject to any disclaimer, the term of this patent is extended or adjusted under 35 U.S.C. 154(b) by 0 days.

(21) Appl. No.: 16/612,801

(22) PCT Filed: Nov. 30, 2017

(86) PCT No.: PCT/JP2017/043030
§ 371 (c)(1),
(2) Date: Nov. 12, 2019

(87) PCT Pub. No.: WO2019/035220
PCT Pub. Date: Feb. 21, 2019

(65) Prior Publication Data
US 2020/0198017 A1    Jun. 25, 2020

(30) Foreign Application Priority Data

Aug. 15, 2017    (JP) .............................. JP2017-156734

(51) Int. Cl.
*B23B 27/14*    (2006.01)
*B23B 51/00*    (2006.01)
(Continued)

(52) U.S. Cl.
CPC .............. *B23B 27/14* (2013.01); *B23B 51/00* (2013.01); *B23C 5/16* (2013.01); *B23D 43/00* (2013.01);
(Continued)

(58) Field of Classification Search
CPC ..... B23B 27/14; B23B 2224/24; C23C 14/06; C23C 14/0641; B23C 5/16
(Continued)

(56) References Cited

U.S. PATENT DOCUMENTS 6,033,734 A * 3/2000 Muenz .................. C23C 14/022
204/192.38
6,558,749 B2 * 5/2003 Braendle ............. C23C 14/0664
204/192.1
(Continued)

FOREIGN PATENT DOCUMENTS

CN    1898406 A    1/2007
CN    105908126 A    8/2016
(Continued)

OTHER PUBLICATIONS

Schuler et al "Structural and optical properties of titanium aluminum nitride filmes (Ti (1-x)Al(x)N" J. Vac. Sci. Technol. A 19 (3) pp. 922-929. (Year: 2001).*
(Continued)

*Primary Examiner* — Archene A Turner
(74) *Attorney, Agent, or Firm* — Locke Lord LLP (57) ABSTRACT

A hard coating film of a coated cutting tool contains Al within a range of 70 at % to 80 at % and Ti within a range of 20 at % to 30 at % with respect to a total amount of metallic (including metalloid) elements, and contains Ar of 0.50 at % or less with respect to a total amount of the metallic elements (including metalloid) and nonmetallic elements. The film has a diffraction peak due to each of a TiN (111) plane, a TiN (200) plane, and a TiN (220) plane of an fcc structure and an AlN (100) plane and an AlN (002) plane of a hcp structure, in which the diffraction peak of the TiN (200) plane indicates a maximum intensity and an intensity of the diffraction peak due to the TiN (111) plane
(Continued)

is next thereafter. The average crystal grain size is within a range of 5 nm to 50 nm.

4 Claims, 2 Drawing Sheets

(51) Int. Cl.
    *B23C 5/16*         (2006.01)
    *B23D 43/00*      (2006.01)
    *B23D 77/00*      (2006.01)
    *B23F 21/00*       (2006.01)
    *C23C 14/06*      (2006.01)

(52) U.S. Cl.
    CPC .............. *B23D 77/00* (2013.01); *B23F 21/00* (2013.01); *C23C 14/06* (2013.01); *B23B 2224/08* (2013.01); *B23B 2224/36* (2013.01); *B23B 2228/08* (2013.01); *B23B 2228/24* (2013.01)

(58) Field of Classification Search
    USPC .................... 51/307, 309; 428/697, 698, 699
    See application file for complete search history.

(56) References Cited

U.S. PATENT DOCUMENTS

| | | | |
|---|---|---|---|
| 8,409,702 B2 * | 4/2013 | Ni | .......................... C23C 28/044 |
| | | | 428/699 |
| 2009/0123779 A1 | 5/2009 | Endler | |
| 2014/0193623 A1 | 7/2014 | Setoyama et al. | |
| 2017/0088937 A1 | 3/2017 | Fuwa et al. | |

FOREIGN PATENT DOCUMENTS

| | | | |
|---|---|---|---|
| EP | 2 860 285 | * | 4/2015 |
| JP | 08-209333 A | | 8/1996 |
| JP | 2005-344148 A | | 12/2005 |
| JP | 2008-545063 A | | 12/2008 |
| JP | 2011-189419 A | | 9/2011 |
| JP | 2013-202700 A | | 10/2013 |
| JP | 2016-064487 A | | 4/2016 |
| JP | 2016-084505 A | | 5/2016 |
| WO | 2014/002948 A1 | | 1/2014 |
| WO | 2014/157688 A1 | | 10/2014 |
| WO | 2015/186413 A1 | | 12/2015 |
| WO | 2017/170536 A1 | | 10/2017 |

OTHER PUBLICATIONS

International Search Report dated Feb. 13, 2018, issued for PCT/JP2017/043030 and English translation thereof.

I, Endler et al., "Novel aluminum-rich Ti1-xAlxN coatings by LPCVD", Surface & Coatings Technology, vol. 2008, No. 203, May 15, 2008, pp. 530-533.(cited in the Jun. 15, 2020 Office Action issued for CN201780091160.3).

Yang et al., "The Monograph of Modern Electrochemical Surface Treatment", Harbin Institute of Technology Press, Oct. 31, 2016, p. 285. (cited in the Jun. 15, 2020 Office Action issued for CN201780091160.3; see the English translation of the CN OA as concise explanation(s) of the relevance).

Office Action dated May 13, 2020, issued for Chinese Patent Application No. 201780091160.3 and English transation of the search rerport.

Office Action dated Jun. 15, 2020, issued for Chinese patent application No. 201780091160.3 and English translation thereof.

Chen Xueding and Han Wenzheng, "Surface Coating Technology", Machinery Industry Press, May 31, 1994, p. 182 and information sheets. (cited in the Sep. 27, 2020 Office Action issued for CN201780091160.3).

Office Action dated Sep. 27, 2020, issued for Chinese patent application No. 201780091160.3 and English translation thereof.

Supplementary European Search Report dated Feb. 18, 2021, issued for European Patent Application No. 17921503.3.

* cited by examiner

COATED CUTTING TOOL

TECHNICAL FIELD

The present invention relates to a coated cutting tool having a hard coating film on a surface of a base material.

Priority is claimed on Japanese Patent Application No. 2017-156734, filed Aug. 15, 2017, the contents of which are incorporated herein by reference.

BACKGROUND ART

A nitride coating film (which will hereinafter be referred to as AlTiN) of Al and Ti is a film of a type having excellent wear resistance and heat resistance and is applied widely to coated cutting tools. Generally, it is known that when the amount of Al in AlTiN increases, the amount of AlN with a hexagonal closest packing structure (which will sometimes be referred to as an hcp structure) increases and a coating film hardness deteriorates. For example, Patent Document 1 discloses AlTiN in which the amount of Al is changed, describing that the coating film hardness deteriorates causing deterioration in tool performance with AlTiN having an hcp structure with a significant amount of Al.

On the other hand, recently, in order to improve lubricity or welding resistance, a hard coating film containing AlN having an hcp structure with a significant amount of Al has also been investigated. For example, Patent Document 2 discloses a coated cutting tool in which a hard coating film containing Cr in a base of AlTiN having a wurtzite-type crystal structure (hcp structure) is provided in an upper layer of a nitride laminated coating film.

Incidentally, an arc ion plating method, which is one of physical vapor deposition methods, is applied to the specific examples of Patent Document 1 and Patent Document 2. Since residual compressive stress is applied to a hard coating film to enhance defect resistance in a physical vapor deposition method, the method is mainly applied to coated cutting tools which are subjected to milling working. Since a high ionization rate of a target and can obtain a hard coating film having excellent adhesion with respect to a base material are exhibited in the arc ion plating method of the physical vapor deposition methods, the method is utilized widely. In the arc ion plating method, coating is performed by vaporizing a target component through an arc discharge. Therefore, a hard coating film unavoidably contains many droplets of several micrometers. On the other hand, in a sputtering method of physical vapor deposition methods, in which coating is performed by sputtering a target component with argon gas, droplets are unlikely to be generated. Therefore, a smooth hard coating film can be obtained. However, since a lower ionization rate of a target is exhibited in the sputtering method compared to the arc ion plating method, voids are easily formed inside a hard coating film and adhesion between the hard coating film and a base material is also poor. Therefore, generally, a hard coating film coated by the sputtering method tends to have lower durability compared to a hard coating film coated by the arc ion plating method.

Recently, a high-output sputtering method in which power applied to targets as in Patent Document 3 and Patent Document 4 is instantaneously increased has begun to be applied.

CITATION LIST

Patent Literature

[Patent Document 1]
  Japanese Unexamined Patent Application, First Publication No. H8-209333
[Patent Document 2]
  PCT International Publication No. WO2014/002948
[Patent Document 3]
  Japanese Unexamined Patent Application, First Publication No. 2011-189419
[Patent Document 4]
  Japanese Unexamined Patent Application, First Publication No. 2013-202700

SUMMARY OF INVENTION

Technical Problem

According to investigation of the inventor, it has become clear that when a nitride containing AlN with an hcp structure composed of Al and Ti as main constituents with a significant amount of Al is coated by an arc ion plating method, a wear area increases in cutting working of stainless steel, and therefore there is room for improvement in the life span of tool.

In consideration of the foregoing circumstances, an object of the present invention is to provide a coated cutting tool in which durability of a nitride containing AlN with an hcp structure composed of Al and Ti as main constituents is enhanced and which has excellent durability.

Solution to Problem

According to an aspect of the present invention, there is provided a coated cutting tool having a hard coating film on a surface of the tool.

The hard coating film is a nitride containing aluminum (Al) within a range of 70 at % to 80 at % and containing titanium (Ti) within a range of 20 at % to 30 at % with respect to a total amount of metallic (including metalloid) elements, and containing argon (Ar) of 0.50 at % or less with respect to a total amount of the metallic elements (including metalloid) and nonmetallic elements.

In X-ray diffraction, the hard coating film has a peak intensity of a TiN (111) plane, a TiN (200) plane, and a TiN (220) plane of a face-centered cubic lattice structure and an AlN (100) plane and an AlN (002) plane of a hexagonal closest packing structure, in which the peak intensity of the TiN (200) plane of the face-centered cubic lattice structure indicates a maximum intensity and the peak intensity due to the TiN (111) plane of the face-centered cubic lattice structure is next thereafter.

An average crystal grain size is within a range of 3 nm to 50 nm.

In a cross-sectional observation of the hard coating film, there are five or fewer droplets having an equivalent circle diameter of 1.0 μm or larger per 100 μm$^2$.

It is preferable that the hard coating film be provided in an outermost layer of the tool which comes into contact with a workpiece.

It is preferable that in the hard coating film, when an amount of the metallic (including metalloid) elements, nitrogen, oxygen, carbon, and argon is 100 at %, an amount of the nitrogen be 51 at % or greater.

Advantageous Effects of Invention

According to the present invention, it is possible to enhance durability of a coated cutting tool coated with a nitride containing AlN with an hcp structure composed of Al and Ti as main constituents.

DESCRIPTION OF EMBODIMENT

The inventor has found that when defects included inside a coating film are reduced after controlling a coating structure and a crystal structure regarding a nitride of Al and Ti containing AlN having a hexagonal closest packing structure (hcp structure) with a significant amount of Al, durability of a coated cutting tool tends to be improved. Hereinafter, an embodiment of the present invention will be described in detail.

A cutting tool of the present embodiment is a coated cutting tool having a hard coating film including a nitride of Al and Ti on a surface of the tool. The coated cutting tool of the present embodiment can be used in a form of a ball end mill, a square end mill, a radius end mill, a multi-blade end mill, an insert, a drill, a cutter, a brooch, a reamer, a hob, a router, or the like.

For example, the coated cutting tool of the present embodiment can be used for cutting working of high-hardness steel, stainless steel, heat resistant steel, cast steel, or carbon steel. Details will be described in examples in the following parts. However, the coated cutting tool of the present embodiment particularly exhibits excellent durability in cutting working of stainless steel.

<Component Composition: Aluminum (Al) and Titanium (Ti)>

The hard coating film according to the present embodiment is a nitride containing aluminum (Al) within a range of 70 at % to 80 at % and containing titanium (Ti) within a range of 20 at % to 30 at % with respect to a total amount of metallic (including metalloid) elements. A nitride composed of Al and Ti as main constituents forms a film of a type having an excellent balance between wear resistance and heat resistance and also has excellent adhesion with respect to a base material. The heat resistance of a hard coating film is further improved by particularly increasing the amount of Al. In addition, when the amount of Al is increased, a protective oxide coating film is easily formed on a tool surface and the coating film structure becomes fine. Therefore, wear of a hard coating film due to welding is curbed easily.

In order for the foregoing effects when adding Al to be exhibited sufficiently, in the hard coating film according to the present embodiment, when all the metallic (including metalloid, the same applies hereinafter) elements make 100 at %, the amount of Al is set to 70 at % or greater. On the other hand, if the amount of Al is increased excessively, the crystal structure of a hard coating film changes and becomes fragile. Therefore, in the hard coating film according to the present embodiment, when all the metallic elements make 100 at %, the amount of Al is set to 80 at % or less.

In the hard coating film according to the present embodiment, when all the metallic elements make 100 at %, the amount of Ti is set to 20 at % or greater. Accordingly, excellent wear resistance can be applied to a hard coating film. On the other hand, if the amount of Ti contained in a hard coating film is increased excessively, it is difficult to obtain the foregoing effects obtained by increasing the amount of Al. Therefore, in the hard coating film according to the present embodiment, when all the metallic elements make 100 at %, the amount of Ti is set to 30 at % or less.

In order to apply more excellent durability to a coated cutting tool, in the hard coating film according to the present embodiment, when all the metallic elements make 100 at %, it is preferable that the total amount of Al and Ti be set to 90 at % or greater. In addition, the hard coating film according to the present embodiment may be a nitride of Al and Ti.

The amount of metallic elements in the hard coating film according to the present embodiment can be measured using an electron probe microanalyzer (EPMA) regarding a hard coating film subjected to specular working. In this case, for example, the amount of metallic elements can be obtained after specular working of a hard coating film surface from an average obtained by analysis at five points using areas having a diameter of approximately 1 μm.

<Crystal Structure>

The hard coating film according to the present embodiment has a significant amount of Al and diffraction peaks of a face-centered cubic lattice structure (fcc structure) and a hexagonal closest packing structure (hcp structure) in X-ray diffraction. Specifically, the hard coating film according to the present embodiment has diffraction peaks due to a TiN (111) plane, a TiN (200) plane, and a TiN (220) plane of an fcc structure and an AlN (100) plane and an AlN (002) plane with an hcp structure. Furthermore, the diffraction peak due to the TiN (200) plane of the fcc structure indicates the maximum intensity and the diffraction peak due to the TiN (111) plane of the fcc structure is next thereafter. That is, the hard coating film according to the present embodiment has a crystal structure mainly constituted as an fcc structure and partially contains AlN with an hcp structure.

In the related art, in X-ray diffraction, if AlN with an hcp structure is contained to an extent that the diffraction peak is confirmed, the intensity of the hard coating film decreases, such that durability of the coated cutting tool becomes insufficient. In contrast, in the present embodiment, durability is improved by reducing defects of droplets, argon, or the like in the hard coating film while causing the crystal grain size to become fine as described below. Accordingly, even if AlN with an hcp structure is contained to the extent that the diffraction peak is confirmed in X-ray diffraction, a coated cutting tool in which deterioration in durability is curbed can be realized.

However, if the amount of AlN with an hcp structure is increased excessively, there are cases where durability of the coated cutting tool deteriorates. Therefore, in the present embodiment, the hard coating film has no diffraction peak of an hcp structure other than the AlN (100) plane and the AlN (002) plane of the hcp structure. In addition, in the hard coating film of the present embodiment, when the sum of peak intensities of the diffraction peaks due to the AlN (100) plane and the AlN (002) plane of the hcp structure is Ih, and when the sum of peak intensities of the diffraction peaks due to the TiN (111) plane, the TiN (200) plane, and the TiN (220) plane of the fcc structure is If, Ih/If is preferably 0.8 or smaller. Ih/If may be 0.3 or greater. Moreover, Ih/If may be 0.5 or greater.

<Average Crystal Grain Size>

In the hard coating film according to the present embodiment, the average crystal grain size of the hard coating film is within a range of 3 nm to 50 nm. If the microstructure of the hard coating film is excessively fine, the structure of the hard coating film becomes close to an amorphous structure. Therefore, toughness deteriorates extremely. In order to enhance crystallinity of a hard coating film and to reduce the amount of a fragile amorphous phase, the average crystal grain size of the hard coating film is set to 3 nm or larger. More preferably, the average crystal grain size of the hard coating film is set to 5 nm or larger. In addition, if the microstructure of the hard coating film becomes excessively coarse, toughness deteriorates and the fracture unit of the hard coating film increases. Therefore, damage to the tool increases. In order to curb damage to the tool by enhancing the toughness of the hard coating film and reducing the fracture unit, the average crystal grain size of the hard coating film is set to 50 nm or smaller. More preferably, the average crystal grain size of the hard coating film is set to 40 nm or smaller. Still more preferably, the average crystal grain size of the hard coating film is set to 30 nm or smaller.

The average crystal grain size of the hard coating film according to the present embodiment is measured from the half width of the diffraction peak due to the TiN (200) plane of the fcc structure indicating the maximum intensity through X-ray diffraction.

<Droplets>

In the hard coating film according to the present embodiment, there are five or fewer droplets having an equivalent circle diameter of 1 μm or larger per 100 μm$^2$ in a cross-sectional observation. In the present embodiment, after the coating film structure is refined in order to further enhance the toughness of the hard coating film, the number of physical defects included in the hard coating film is reduced. In a hard coating film coated by a physical vapor deposition method, droplets may become the main physical defect. In particular, since coarse droplets having an equivalent circle diameter of 1 μm or larger may become origins of fracture inside a hard coating film, the toughness of the hard coating film can be enhanced by reducing a generation frequency thereof. In the present embodiment, in order to enhance toughness of a nitride containing AlN with an hcp structure composed of Al and Ti as main constituents, in a cross-sectional observation of the hard coating film, there are five or fewer droplets having an equivalent circle diameter of 1 μm or larger per 100 μm$^2$. More preferably, there are three or fewer droplets per 100 μm$^2$. Still more preferably, there are one or fewer droplets per 100 μm$^2$. Moreover, it is preferable that droplets having an equivalent circle diameter of 5 μm or larger be not contained.

In addition, regarding a surface of the hard coating film as well, it is preferable that there be five or fewer droplets having an equivalent circle diameter of 1 μm or larger per 100 μm$^2$. More preferably, there are three or fewer droplets per 100 μm$^2$ on the surface of the hard coating film. Still more preferably, there are one or fewer droplets per 100 μm$^2$ on the surface of the hard coating film.

In order to evaluate droplets in a cross-sectional observation of the hard coating film, after being subjected to specular working, the hard coating film is worked by a converged ion beam method, a plurality of fields of view on the surface subjected to specular working are observed using a transmission electron microscope at 5,000 to 10,000 magnification. In addition, the number of droplets on the surface of the hard coating film can be obtained by observing the surface of the hard coating film using a scanning electron microscope (SEM) or the like.

<Argon (Ar) Content>

The hard coating film according to the present embodiment contains argon (Ar) of 0.50 at % or less with respect to the total amount of metallic elements and nonmetallic elements.

The generation frequency of droplets which may become defects in a hard coating film can be reduced by applying a sputtering method. On the other hand, in the sputtering method, since a target component is subjected to sputtering using argon ions, a hard coating film coated by the sputtering method contains a small amount of argon. In particular, argon is likely to be concentrated at crystal grain boundaries, when the crystal grain size becomes those of granules, the amount of argon tends to increase. However, when the amount of argon is increased, a bonding force between grains deteriorates at crystal grain boundaries. As in the hard coating film according to the present embodiment, in a nitride containing AlN with an hcp structure composed of Al and Ti as main constituents, since excessively included argon may become a defect, it is effective that the amount thereof is set to a certain level or lower. Specifically, the hard coating film according to the present embodiment contains argon of 0.50 at % or less with respect to the total amount of the metallic elements and the nonmetallic elements. More preferably, the hard coating film of the present embodiment contains argon of 0.40 at % or less.

In the sputtering method, when it is intended that the amount of argon included in a hard coating film be made as close as possible to 0 at %, the flow rate of argon becomes excessively small and sputtering becomes unstable. In addition, even if the amount of argon is approximated to 0 at %, basic characteristics such as toughness, heat resistance, and wear resistance as a hard coating film to be applied to a cutting tool may be impaired. In the hard coating film according to the present embodiment, the lower limit for the amount of argon is not limited particularly. However, in order to stabilize the sputtering method and to ensure basic coating film characteristics as a hard coating film to be applied to a cutting tool, it is preferable that argon of 0.10 at % or more be contained. More preferably, argon of 0.15 at % or more is contained in the hard coating film.

Similar to the foregoing measurement of the amount of the metallic elements, the amount of argon in the hard coating film according to the present embodiment can be measured using an electron probe microanalyzer (EPMA) regarding a hard coating film subjected to specular working. Similar to the foregoing measurement of the amount of the metallic elements, it can be obtained after specular working from an average obtained by analysis at five points using areas having a diameter of approximately 1 μm.

In addition to nitrogen, the hard coating film according to the present embodiment may include very small amounts of argon, oxygen, and carbon as nonmetallic elements. The amount of argon in a hard coating film can be obtained while the amount of the metallic (including metalloid) elements, nitrogen, oxygen, carbon, and argon is 100 at %.

In addition, in the hard coating film according to the present embodiment, when the amount of the metallic (including metalloid) elements, nitrogen, oxygen, carbon, and argon is 100 at %, it is preferable that the amount of nitrogen be 50 at % or greater. Accordingly, nitrides are sufficiently formed in the hard coating film and durability tends to be excellent. However, if the amount of nitrogen is increased excessively, the hard coating film is likely to cause self-destruction. Therefore, it is preferable that the amount of nitrogen be 52% or lower. In evaluation, a value after the decimal point may be rounded down.

<Metallic Elements Other than Aluminum (Al) and Titanium (Ti)>

The hard coating film according to the present embodiment may contain metallic elements other than Al and Ti. For example, for the purpose of improving wear resistance, heat resistance, and the like, the hard coating film according to the present embodiment can contain elements of Group 4a, Group 5a, and Group 6a in the periodic table and one or more elements selected from Si, B, and Y. These elements are generally contained in order to improve coating film characteristics of a hard coating film and can be added within a range in which durability of a coated cutting tool does not deteriorate extremely.

<Component Composition: Oxygen (O) and Carbon (C)>

Although the hard coating film according to the present embodiment is a nitride, it may contain very small amounts of oxygen and carbon in addition to argon described above. Since these elements form a very small amount of oxides or carbides in a nitride, the toughness of a hard coating film may deteriorate. If the amounts of oxygen and carbon unavoidably contained in a hard coating film can be reduced in the film thickness direction, toughness of a nitride containing AlN with an hcp structure composed of Al and Ti as main constituents can be enhanced. In the hard coating film according to the present embodiment, more oxygen than carbon tends to be present as unavoidable impurities.

In the hard coating film according to the present embodiment, in order to reduce a minute amount of oxides contained in the hard coating film as much as possible, it is preferable that the amount of oxygen be set to 5.0 at % or lower in the film thickness direction. More preferably, the amount of oxygen is set to 4.0 at % or lower. In addition, in order to reduce a minute amount of carbides contained in the hard coating film as much as possible, it is preferable that the amount of carbon be set to 3.0 at % or lower in the film thickness direction. More preferably, the amount of carbon is set to 1.5 at % or lower.

The amounts of oxygen and carbon in the film thickness direction can be obtained using a scanning X-ray photoelectron spectroscope device. Furthermore, the amounts of oxygen and carbon may be obtained while the amount of the total amount of carbon, nitrogen, oxygen, and the metallic (including metalloid) elements is 100 at %. Since large amounts of oxygen and carbon which have adhered from the atmosphere as unavoidable impurities are detected on the outermost surface of a hard coating film, analysis is performed from a position at a depth of 50 am from the coating film surface in the film thickness direction.

In addition, when sputtering is performed using a mixed gas containing other rare gases in addition to argon, the hard coating film according to the present embodiment may also contain rare gases in addition to argon.

In the coated cutting tool of the present embodiment, in order to further improve adhesion of a hard coating film, as necessary, an intermediate layer may be provided separately between the base material of the tool and the hard coating film. For example, a layer composed of any one of a metal, a nitride, a carbonitride, and a carbide may be provided between the base material of the tool and the hard coating film. In addition, a hard coating film having a component ratio or a composition different from that of the hard coating film according to the present embodiment may be formed separately on the hard coating film according to the present embodiment. Moreover, the hard coating film according to the present embodiment and a hard coating film having a composition ratio or a composition different from that of the hard coating film according to the present embodiment may be laminated separately on one another.

The hard coating film according to the present embodiment is preferable because it is provided as the outermost layer of a tool which comes into contact with a workpiece, such that a sufficient amount of a protective oxide coating film is formed on the tool surface such that an effect of curbing adhesion is exhibited sufficiently.

When the hard coating film according to the present embodiment is coated, a sputtering method is applied. In the method, three or more AlTi-based alloy targets are used, and power is applied sequentially to the targets. When the target for applying power is switched, there is a time during which power is applied simultaneously to both targets including a target where application of power ends and a target where application of power starts. In such a sputtering method, a state of a high ionization rate of a target is maintained during coating, a dense hard coating film having granules at a micro-level can be obtained, and there tends to be less argon, oxygen, and carbon which are unavoidably contained. Furthermore, it is preferable that pre-discharging be performed while the internal temperature of a furnace of a sputtering device is set to 450° C. or higher, the flow rate of nitrogen gas introduced into the furnace is set to 60 sccm or greater, and the flow rate of argon gas is set in a range of 70 sccm to 200 sccm. In addition, it is preferable that the internal pressure of the furnace be set in a range of 0.5 Pa to 0.7 Pa.

It is preferable that the maximum power density of a power pulse be set to 1.0 $kW/cm^2$ or higher. It is more preferably set to 1.2 $kW/cm^2$ or higher. However, if the power density applied to a target becomes excessively high, film formation is unlikely to be stable. In addition, if the power density is excessively high, the generation frequency of droplets tends to increase even in the sputtering method. Therefore, it is preferable that the maximum power density of the power pulse be set to 3.0 $kW/cm^2$ or lower. It is more preferable that the maximum power density of the power pulse be set to 2.0 $kW/cm^2$ or lower. In addition, it is preferable that the time during which power is applied simultaneously to both alloy targets including an alloy target where applying of power ends and an alloy target where applying of power starts be set in a range of 5 microseconds to 20 microseconds to reduce droplets and enhance basic characteristics of the hard coating film.

Example 1

<Tool>

As a tool, an ultra-hard alloy blade tip replacing tool (manufactured by Mitsubishi Hitachi Tool Engineering Ltd.) having a composition of WC (bal.)-Co (11.5 mass %)-TaC (2.0 mass %)-$Cr_3C_2$ (0.7 mass %), and a hardness of 89.5 HRA (Rockwell hardness, a value measured based on JIS G 0202) was prepared.

In the present Example 1 and Comparative Example 1, a sputtering device in which six sputter vaporization sources can be mounted was used. Three AlTi-based alloy targets of these vapor deposition sources were installed inside the device as the vapor deposition sources. Targets having a dimension of ϕ16 cm and a thickness of 12 mm were used. The compositions of the AlTi-based alloy targets used in the present Example 1 and Comparative Example 1 were changed.

The tool was fixed to a sample holder inside the sputtering device, and a bias power supply was connected to the tool. The bias power supply had a structure for applying a negative bias voltage to the tool independent from the target.

The tool revolved twice every minute and rotated via a fixing jig and the sample holder. The distance between the tool and the target surface was set to 100 mm.

Ar and $N_2$ were used as introduction gases and were introduced through a gas supply port provided in the sputtering device.

<Bombardment Treatment>

First, before the tool was coated with a hard coating film, the tool was subjected to bombardment treatment by the following procedure. In a state where the internal temperature of the furnace became 430° C. due to a heater inside the sputtering device, heating was performed for 30 minutes. Thereafter, the inside of the furnace of the sputtering device was evacuated to set the internal pressure of the furnace to $5.0 \times 10^{-3}$ Pa or lower. Then, Ar gas was introduced into the furnace of the sputtering device, and the internal pressure of the furnace was adjusted to 0.8 Pa. Furthermore, a DC bias voltage of −170 V was applied to the tool, and cleaning (bombardment treatment) of the tool was performed by Ar ions.

<Coating of Hard Coating Film>

Subsequently, the tool was coated with a nitride of Al and Ti by the following procedure.

In the present Example 1 and Comparative Example 1, while the internal temperature of the furnace was maintained at 430° C., Ar gas was introduced into the furnace of the sputtering device at 160 sccm, $N_2$ gas was introduced at 120 sccm thereafter, and the internal pressure of the furnace was set to 0.60 Pa. A DC bias voltage of −60 V was applied to the tool. Furthermore, a discharge time per cycle of power applied to the alloy targets containing Al and Ti was set to 4.0 milliseconds. When the alloy target for applying power was switched, the time during which power was applied simultaneously to the two alloy targets including an alloy target where applying of power ended and an alloy target where applying of power started was set to 10 microseconds. Power was applied continuously to the three AlTi-based alloy targets, and the surface of the tool was coated with a hard coating film of approximately 3.0 μm. At this time, the maximum power density of the power pulse was set to 1.5 kW/cm$^2$, and the average power density was set to 0.37 kW/cm$^2$.

In Comparative Examples 2 to 4, an arc ion plating device was used. The AlTi-based alloy targets were installed inside the device as the vapor deposition sources. Targets having a dimension of 416 cm and a thickness of 12 mm were used. In Comparative Example 2 to Comparative Example 4, the compositions of the AlTi-based alloy targets to be used were changed. Similar to the present Example 1, cleaning (bombardment treatment) of the tool was performed by Ar ions. Next, the arc ion plating device was evacuated to an internal pressure of the furnace of $5.0 \times 10^{-3}$ Pa or lower, the internal temperature of the furnace was set to 500° C., and $N_2$ gas was introduced such that the internal pressure of the furnace became 3.2 Pa. Next, a DC bias voltage of −120 V was applied to the tool, and a current of 200 A was applied to the AlTi alloy targets, thereby coating the surface of the tool with a hard coating film of approximately 3.0 μm.

<Coating Film Composition>

Regarding the coating film composition of the hard coating film, the coating film composition of the hard coating film was measured using an attached wavelength dispersive X-ray spectroscopy electron probe micro-analyzer (WDS-EPMA) using an electron probe microanalyzer (JXA-8500F manufactured by JEOL Ltd.). A ball end mill for physical property evaluation was subjected to specular working, the accelerating voltage was set to 10 kV, the irradiation current was set to $5 \times 10^{-8}$ A, the fetching time was set to 10 seconds, and five points of a range of which the analysis region had a diameter of 1 μm were measured, thereby obtaining the amount of a metal and the amount of Ar in the total amount of the metal component and the non-metal component in the hard coating film from the average value thereof.

<Crystal Structure and Crystal Grain Size>

The crystal structure of the hard coating film was confirmed using an X-ray diffractometer (EMPYREAN manufactured by PANalytical Ltd.) under measurement conditions of a tube voltage of 45 kV, a tube current of 40 mA, a Cukα X-ray source ($\lambda=0.15405$ nm), and 2θ within a range of 20 to 80 degrees. In addition, the average crystal grain size of the hard coating film was calculated from the half width of the diffraction peak indicating the maximum intensity.

<Coating Film Hardness and Elastic Coefficient>

The coating film hardness and the elastic coefficient of the hard coating film were analyzed using a nanoindentation tester (ENT-2100 manufactured by ELIONIX INC.). In the analysis, a cross section of a coating film in which a test piece was tilted five degrees with respect to the outermost surface of the coating film was subjected to mirror polishing. Thereafter, a region in which the maximum thrust depth became substantially less than 1/10 of the film thickness inside the polished surface of the coating film was selected. Measurement was performed at ten points under a measurement condition of a thrust load of 49 mN/second, and the average value of six points, excluding the two points with largest and the two points with the smallest values, was obtained.

<Cutting Test>

A cutting test was performed using the produced coated cutting tool. Table 1 shows the analysis results and the cutting test results. The cutting conditions were as follows.

(Condition) Dry Working

Tool: insert-type radius end mill

Cutter type number: RV4B050R-5

Insert type number: RPHT1204MOEN-C8

Cutting method: bottom-surface cutting

Workpiece: SUS630 (35 HRC)

Cut: 1.0 mm in the axial direction and 30.0 mm in the radial direction

Cutting speed: 300.0 m/min

Feeding rate per blade: 0.15 m/blade

Number of blades: 1

Cutting distance: 2 m

Evaluation method: after cutting working, observation was performed using a tool microscope at a magnification of 10 times, and the abraded region between the tool and the workpiece was measured. A part having the largest abrasion region was set as the largest wear area.

In each of the samples, the coating film characteristics and the coating film structure were observed. Table 1 shows the results of the coating film characteristics and the cutting evaluation.

TABLE 1

| Sample No. | Coating film composition (at %) | Ar content (at %) | Ih/If | Average crystal grain size (nm) | Nanoindentation hardness (GPa) | Elastic coefficient (GPa) | Largest wear area (μm) |
|---|---|---|---|---|---|---|---|
| Present Example 1 | (Al75Ti25)N | 0.25 | 0.7 | 6 | 26 | 311 | 255 |
| Comparative Example 1 | (Al83Ti17)N | 0.19 | 100 | 8 | 24 | 299 | peeled off |
| Comparative Example 2 | (Al71Ti29)N | 0 | 0 | 6 | 33 | 446 | 368 |
| Comparative Example 3 | (Al79Ti21)N | 0 | 0.7 | 17 | 27 | 315 | peeled off |
| Comparative Example 4 | (Al91Ti9)N | 0 | 100 | 17 | 27 | 371 | peeled off |

Figure 2:
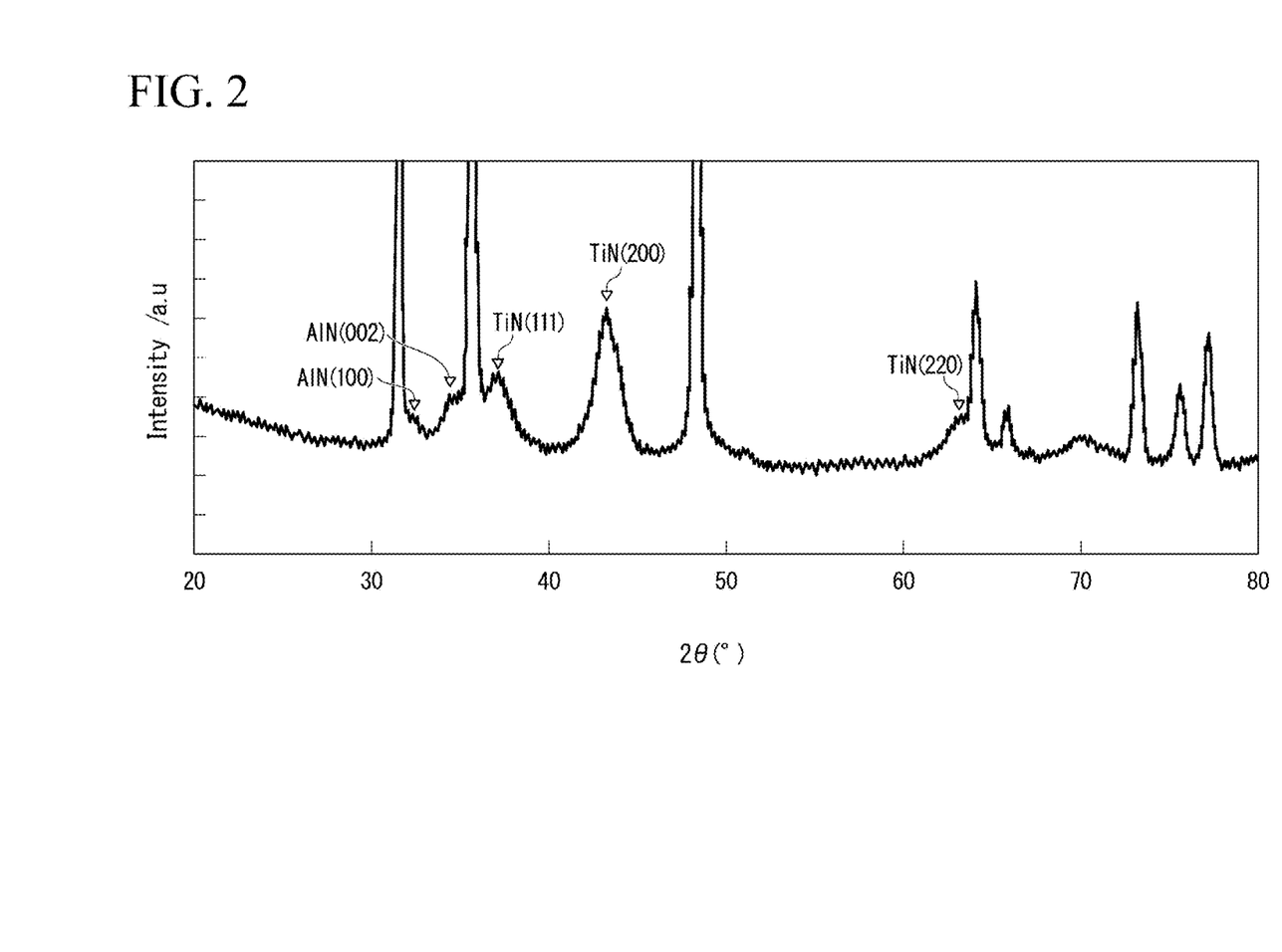
FIG. 2 shows results of X-ray diffraction of the present Example 1.

In the present Example 1, compared to Comparative Example 2 coated by an arc ion plating method, it was confirmed that the largest wear area was reduced and excellent durability was exhibited. FIG. 2 shows X-ray diffraction measurement results of the present Example 1. It was confirmed that the present Example 1 had peak intensities in the AlN (100) plane and the AlN (002) plane of the hcp structure. Comparative Example 2 was a nitride of Al and Ti in the related art having an fcc structure. However, in the present Example 1, the largest wear area was reduced by 100 μm or larger with respect to Comparative Example 2. As a reason therefor, it was assumed that durability was enhanced even if the hard coating film partially had an hcp structure and an effect of a significant amount of Al was exhibited because there were less defects of droplets included inside the hard coating film, argon, or the like in the present Example 1.

In Comparative Examples 3 and 4, although coating was performed by the arc ion plating method, the hard coating film has the peak intensity of the hcp structure. Therefore, peeling off occurred in an early stage.

Figure 1:
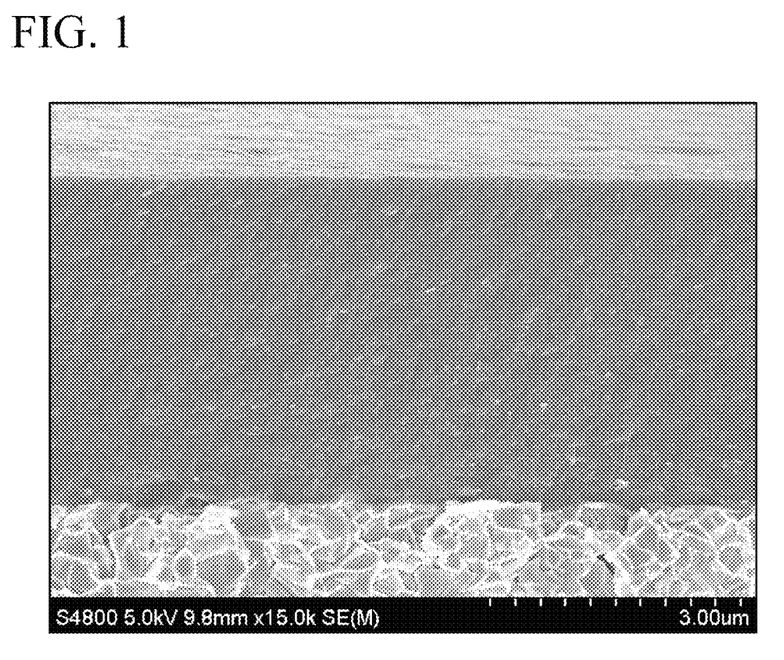
FIG. 1 is a cross-sectional observation photograph of the present Example 1 taken with an electron microscope.

FIG. 1 shows a cross-sectional observation photograph of the present Example 1. It was confirmed that the hard coating film according to the present invention was extremely smooth. In the hard coating film according to the present invention, there was one or fewer droplets having an equivalent circle diameter of 1.0 μm or larger per 100 μm² in a cross-sectional observation. In addition, no droplets having an equivalent circle diameter of 5.0 μm or larger were confirmed. On the other hand, in all of the hard coating films coated by the arc ion plating method, tens of droplets having an equivalent circle diameter of 1.0 μm or larger per 100 μm² were confirmed. In addition, droplets having an equivalent circle diameter of 5.0 μm or larger were also confirmed.

In Comparative Example 1, similar to the present Example, it was assumed that although there were less defects of droplets, argon, or the like, a (101) plane having an hcp structure indicated the maximum intensity so that the toughness of the hard coating film deteriorated and peeling off occurred in an early stage.

The hard coating film according to the present Example 1 was subjected to microanalysis. In the hard coating film according to the present Example 1, it was confirmed that oxygen was within a range of 1.5 to 3.0 at % and carbon was 1.0 at % or less from a position at a depth of 50 nm in the film thickness direction from the outermost surface, that is, slight amounts of oxygen and carbon were contained, through analysis using a scanning X-ray photoelectron spectroscope device.

In addition, when the structure was observed using a transmission electron microscope, it was confirmed that there was one or fewer voids of which the longest diameter was 10 nm or larger within an area of 50 nm×50 nm while they were dense at a micro-level.

Example 2

In Example 2, evaluation was performed using an ultra-hard four-blade square end mill. Three kinds, such as the present Example 20, the present Example 21, and Comparative Example 20 were used for evaluation.

In the present Example 20 and Comparative Example 20, the hard coating film was coated by a film formation method similar to those of the present Example 1 and Comparative Example 2 in Example 1. In the present Example 21, regarding coating of the hard coating film, the hard coating film was coated under conditions similar to those of Example 1, except that Ar gas was introduced into the furnace of the sputtering device at 160 sccm, N₂ gas was introduced at 160 sccm, and the internal pressure of the furnace was set to 0.68 Pa. The cutting conditions were as follows.

<Cutting Test>

(Condition) Wet Working

Tool: ultra-hard four-blade square end mill

Type number: EPP4060, radius of tool 3.0 mm

Cutting method: bottom-surface cutting

Workpiece: SUS304

Cut: 6.0 mm in the axial direction and 0.2 mm in the radial direction

Cutting speed: 60.0 m/min

Feeding rate per blade: 0.04 mm/blade

Cutting distance: 50 m

Evaluation method: after cutting working, observation was performed using a tool microscope at a magnification of 50 times, and the abraded region between the tool and the workpiece was measured. A part having the largest abrasion region was set as the largest wear area. In each of the samples, the coating film characteristics and the coating film structure were observed. Table 2 shows the results of the coating film characteristics and the cutting evaluation.

TABLE 2

| Sample No. | Coating film composition (at %) | N*100/(Me + N + C + O+ Ar) (%) | Ar content (at %) | Ih/If | Average crystal grain size (nm) | Nanoindentation hardness (GPa) | Elastic coefficient (GPa) | Largest wear area (μm) |
|---|---|---|---|---|---|---|---|---|
| Present Example 20 | (Al70Ti30)N | 50 | 0.26 | 0.7 | 6 | 26 | 311 | 42 |
| Present Example 21 | (Al72Ti28)N | 51 | 0.26 | 0.8 | 5 | 25 | 318 | 38 |
| Comparative Example 20 | (Al65Ti35)N | 49 | 0 | 0 | 8 | 32 | 439 | 48 |

In Comparative Example 20, partial fine chipping was confirmed. The present Examples 20 and 21 exhibited a stable wear form, and the largest wear area was also smaller than that of Comparative Example 20.

In the present Example 21 in which the gas flow rate of nitrogen at the time of film formation was increased, the amount of nitrogen when the amount of the metallic elements, nitrogen, oxygen, carbon, and argon was 100 at % became 51%, that is, a amount of nitrogen was higher than those of other samples. In the present Example 21, it was assumed that the largest wear area was further reduced because the amount of nitrogen was high and nitrides were formed sufficiently in the microstructure.

What is claimed is:

1. A coated cutting tool comprising:
   a hard coating film on a surface of the tool,
   wherein the hard coating film is a nitride containing aluminum (Al) within a range of 70 at % to 80 at % and containing titanium (Ti) within a range of 20 at % to 30 at % with respect to a total amount of metallic (including metalloid) elements, and containing argon (Ar) of 0.50 at % or less with respect to a total amount of the metallic elements (including metalloid) and nonmetallic elements,
   wherein in X-ray diffraction, the hard coating film has a diffraction peak due to each of a TiN (111) plane, a TiN (200) plane, and a TiN (220) plane of a face-centered cubic lattice structure and an AlN (100) plane and an AlN (002) plane of a hexagonal closest packing structure, in which the diffraction peak due to the TiN (200) plane of the face-centered cubic lattice structure indicates a maximum intensity and an intensity of the diffraction peak due to the TiN (111) plane of the face-centered cubic lattice structure is next thereafter,
   wherein an average crystal grain size is within a range of 3 nm to 50 nm, and
   wherein in a cross-sectional observation of the hard coating film, there are five or fewer droplets having an equivalent circle diameter of 1.0 μm or larger per 100 μm².

2. The coated cutting tool according to claim 1, wherein the hard coating film is provided in an outermost layer of the tool which comes into contact with a workpiece.

3. The coated cutting tool according to claim 1, wherein in the hard coating film, when an amount of the metallic (including metalloid) elements, nitrogen, oxygen, carbon, and argon is 100 at %, an amount of the nitrogen is 51 at % or greater.

4. The coated cutting tool according to claim 2, wherein in the hard coating film, when an amount of the metallic (including metalloid) elements, nitrogen, oxygen, carbon, and argon is 100 at %, an amount of the nitrogen is 51 at % or greater.

* * * * *